PROCESS FOR PASSIVATING PLANAR SEMICONDUCTOR DEVICES

Filed Nov. 24, 1964 2 Sheets-Sheet 1

Inventors
DAVE F. T. DUNSTER
JOHN K. ARTHURS
By [signature]
Attorney

Inventors
DAVE F. T. DUNSTER
JOHN K. ARTHURS
By [signature]
Attorney 3,312,577

PROCESS FOR PASSIVATING PLANAR SEMICONDUCTOR DEVICES

Dave Francis Thomas Dunster and John Kenneth Arthurs, London, England, assignors to International Standard Electric Corporation, New York, N.Y., a corporation of Delaware Filed Nov. 24, 1964, Ser. No. 413,420
5 Claims. (Cl. 148—187)

Figure 1:
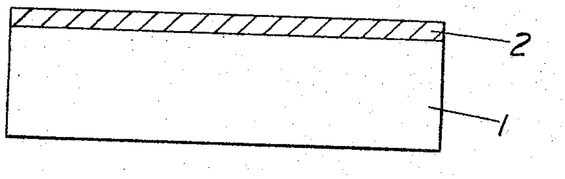

This invention relates to the manufacture of semiconductor devices including transistors, and to an improved transistor structure. More particularly, the invention relates to the manufacture of junction semi-conductor devices by successive masking and solid state diffusion processes whereby successive p-n junctions which extend to the surface of a semiconductor are protected at the surface by a layer of durable oxide.

In the manufacture of semiconductor devices particularly for use at high frequencies, the devices are of necessity extremely small, and difficulties inevitably arise firstly in providing sufficient exposed area of the base material (i.e., the semiconductor wafer) between the various junctions for attachment of an ohmic contact, and secondly in preventing short circuiting between lead wires attached to the various exposed areas. A method of manufacture of such devices that produces the type commonly known as "planar" is to mask the whole wafer initially by means of an insulating layer and to expose portions of the wafer successively (by a chemical treatment) to enable the necessary processing by solid state diffusion of an impurity material to be carried out. The planar method solves the two above mentioned problems and additionally provides a passivating layer of insulating material over the ends of the p-n junctions.

An object of the invention is to make improved semiconductor devices which are not subject to contamination at their exposed surfaces, and according to the invention, there is provided a method of manufacturing semiconductor junction devices which comprises the production of a plurality of junctions between p-type and n-type material, the terminations of which are all brought to the same plane surface by means of differential masking of impurities to be diffused into the semiconductor body by the interposition of a non-conducting layer in which apertures are produced by photo-resist processes, producing a layer of fresh oxide of the semiconductor below the initial non-conducting layer that has been used as a diffusion mask, subsequent to the said masking and diffusion processes, forming apertures in the resulting masking and diffusion processes, forming apertures in the resulting non-conducting layer to expose areas to which access is required, and attaching electrical contacts to the newly exposed areas of the semiconductor surface.

The invention also comprises a junction semiconductor device in which the junction terminations are all brought to the same plane surface and are there covered with a layer of oxide of the semiconductor, which layer has been freshly produced by an oxidation process subsequent to a masking and diffusion process so as to lie below a layer of oxide which has previously been used as a diffusion mask.

One type of junction transistor which is suitable for high frequency applications is the double diffused transistor, and although this invention is adapted for use with other semiconductor devices, the invention will be described in what follows in its relation to silicon diodes and transistors.

The invention will now be described with reference to the accompanying drawing illustrating two embodiments.

Figure 2:
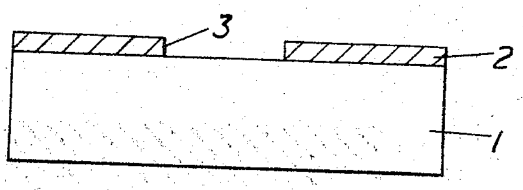
Figures 3, 4:
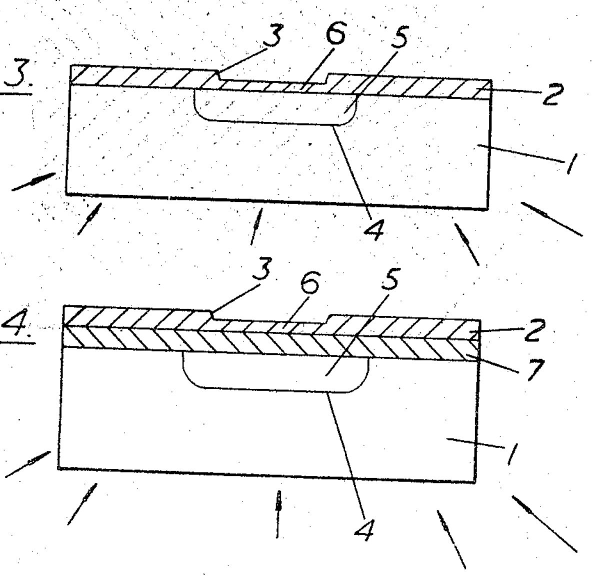
Figure 5:
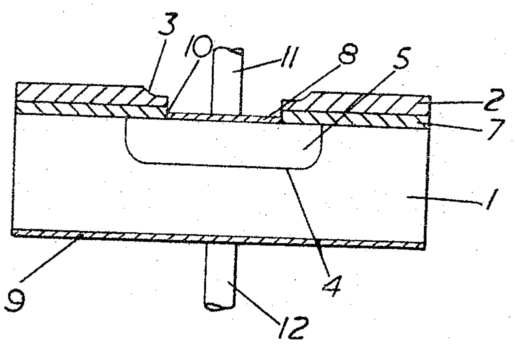
Figure 6:
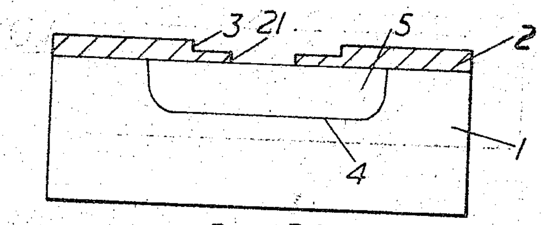

In the drawing, FIGS. 1 to 5 illustrate steps in the preparation of a silicon diode, whilst FIGS. 1 to 3 taken together with FIGS. 6 to 10 illustrate steps in the preparation of a silicon transistor, the figures indicating sectional elevations through a silicon wafer at the various stages of manufacture.

Referring to the first embodiment illustrated by FIGS. 1 to 5, FIG. 1 shows a wafer 1 formed of n-type silicon, to one surface of which an insulating layer 2 has been applied. This insulating layer is preferably silicon oxide, prepared in any well known manner, e.g., thermally by the action of oxygen on silicon at high temperature; or by the action of steam, either alone or in the presence of oxygen on silicon at high temperatures; or by pyrolitic deposition of a protective coating by the action of cracking a chemical compound containing silicon and oxygen. By "steam" is meant either water vapour, obtained by boiling water, which is passed into a tube at a high temperature, or a deliberately wet gas passed into a tube at high temperatures. At this stage, the wafer preferably forms part of a larger slice of silicon which is uniformly oxidised and is subdivided into individual units at a later stage, processing being more conveniently carried out on the larger unit.

An aperture (for an individual unit), or a number of apertures (for a composite unit), are then formed in the oxide layer by a photo-resist technique and subsequent etching with an etching solution containing fluoride salt or hydrofluoric acid, so as to form the oxide coating into a mask, as shown for an individual unit in FIG. 2, where the aperture is indicated at 3.

The next step in the manufacturing technique is to diffuse an acceptor impurity into the n-type wafer through the aperture 3, using as a starting material an element from Group III of the Periodic Table, preferably in combination with silicon. When this material is applied to the silicon through the aperture 3 and the temperature is raised, at first alloying and then solid-state diffusion takes place, a p–n junction forming in the wafer and advancing outwards until a state of affairs as shown in FIG. 3 is attained. Here the arrows indicate the application of heat, while 4 denotes the junction which terminates at the surface of the wafer along a line just outside of the masking aperture, i.e., below the original silicon oxide layer. Reference 5 indicates the p-type zone formed. Owing to the heating which is carried out in an oxidising atmosphere, fresh oxide, indicated at 6, is formed on the silicon exposed through the aperture.

It is a well established principle of the planar type of diffused semiconductor device, which is the type of device produced by the process described above, that the termination of each p-n junction at the surface of the semiconductor should occur below a protective layer of silicon oxide, the junction thus being "passivated," i.e., protected from the ambient atmosphere and surface contaminants. However, this principle assumes that the silicon oxide used for passivation is a pure film, which, in fact, it is not if it is the same film as has been used as a mask in selective diffusion of impurities into the body of the semiconductor from the surface. Although steps may be taken to reduce the amount of contamination of this oxide that occurs during the high temperature diffusion operations necessary to produce the diffused p–n junction (such as careful cleaning of the oxide surface after a short "deposition" of impurities on the surface and before a longer "drive in" of the impurities from the surface compound phase, by solid state diffusion, into the silicon), nevertheless a degree of contamination of the oxide occurs which is sufficient to have a deleterious effect on the electrical performance of that junction. One method of overcoming this defect is to remove the entire oxide layer at this stage of the process, i.e., after "driving-in" the required impurity to form a p–n junction, and replacing it with a fresh clean oxide layer, formed in a manner similar to that with which the original oxide layer was formed, as described in British application No. 34,041/62 (I. H. Morgan-B. page 3–1).

In the present invention, however, the fresh oxide layer is produced on the surface of the silicon body without first removing the contaminated layer.

To continue with the explanation of the manufacturing process, the silicon wafer is heated in an oxidising atmosphere, as described above, so as to increase the thickness of the silicon oxide layer on its surface. The temperature at this stage of the process is high with respect to room temperature but is low with respect to the temperatures used for driving-in impurities in the solid state diffusion of p–n junctions. Now the oxide layer is thickened by growth which occurs as a result of the interaction of silicon and oxygen atoms, this interaction being most evident at the silicon-silicon oxide interface, and hence the main growth occurs at the bottom of the film, the original oxide being pushed away from the silicon by new oxide. This new oxide is contaminated to a much smaller degree than was the original oxide, hence justifying the term "clean oxide," and is shown as 7 in FIG. 4.

The final steps in the manufacture of this diode consist firstly in the opening up again of the oxide layers 6 and 7 over the p-type region 5 by chemical etching; and secondly plating or otherwise depositing ohmic contacts 8 and 9, 8 within the aperture 10 so formed and 9 on the other surface of the wafer, together with the requisite lead wires, 11 and 12.

The manufacture of a 3-electrode semi-conductor device (transistor) by the process of double diffusion, the second embodiment mentioned above, as modified by the present invention will now be described with reference to FIGS. 1 to 3 and 6 to 10.

The initial steps in the manufacture are identical with those described above for the diode, and illustrated in FIGS. 1 to 3. At this point, the oxide layer 6 grown during the first diffusion process is etched by acid or otherwise to produce an aperture 21 (FIG. 6) of reduced size, exposing a portion of the p-type region 5 beneath but leaving a substantial overhang of protective oxide around the aperture. The region 5 constitutes the base of the transistor and a second region 22 is now diffused into the base region by the application of a suitable impurity at the aperture 21 and a second heating process.

Figures 7, 8:
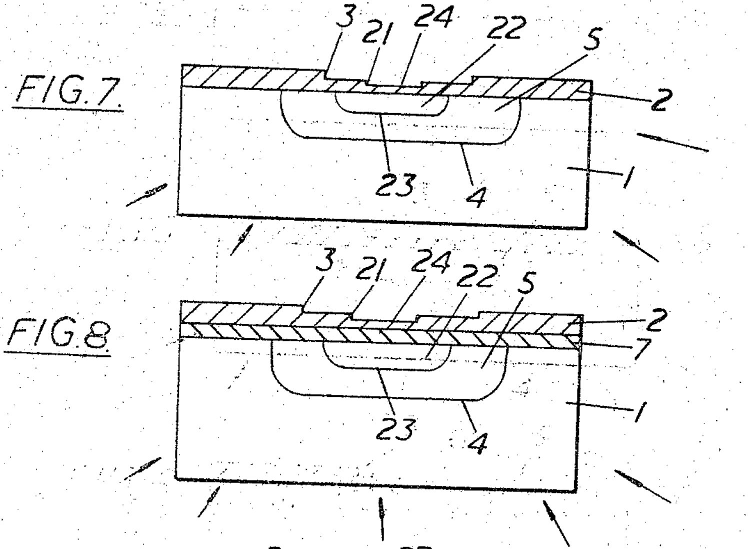
Figure 9:
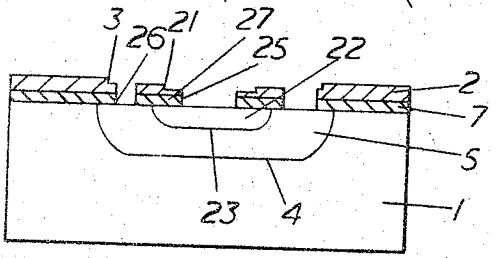
Figure 10:
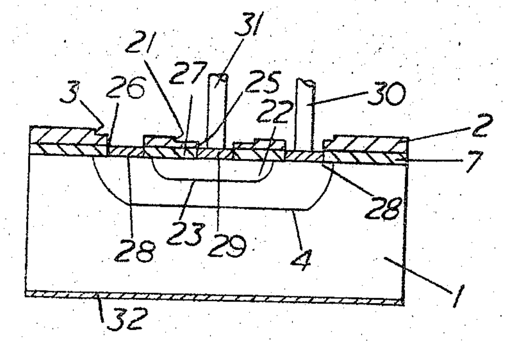

This process is precisely controlled and the diffusion takes place at such a rate and to such an extent that a second junction 23 (base/emitter) is formed and terminates at the wafer surface beneath the edge of the reduced size aperture (FIG. 7). This second "drive-in" process having been conducted in an oxidising atmosphere, a fresh oxide, indicated at 24, is formed on the silicon exposed through the aperture (in the same way that oxide 6 was formed).

The original and secondary oxide layers, both contaminated either by use as diffusion masks or by reason of being grown in contaminating conditions, are then raised from the silicon surface by the growth of a new, cleaner oxide layer 7 at the silicon-silicon oxide interface (FIG. 8). These layers are then selectively etched by a photo-resist technique to produce apertures 25 and 26 (FIG. 9), aperture 26 being annular and surrounding aperture 25, giving access respectively to emitter region 22 and base region 5, an annular portion of oxide 27 being left to protect the end of the emitter junction. The exposed semiconductor surfaces may now be metallised to produce low resistance ohmic contacts, as at 28 and 29, FIG. 10, and leads 30 and 31 attached by well-known bonding techniques. A contact may be made to the opposite side of the wafer at 32 to give access to the collector and this may be made at this stage or before the attachment of leads 30 and 31, as convenient.

It may be observed that the use of silicon oxide as a masking member in the diffusion process is based on the assumption that the doping elements do not react, or pass through it to any significant extent. This is substantially true, but there are exceptions, for instance the Group III element gallium, and possibly some other elements, which must therefore be excluded from use in this process. Even so, the oxide, as stated, becomes contaminated with impurities during the processing, and ceases to be a satisfactory protection for the exposed ends of the junctions for the anticipated life of the device. It is for this reason that fresh oxide is preferably grown below the contaminated oxide. It may also be observed that some solid state diffusion takes place during the growth of the fresh oxide and must be allowed for in the times for which impurities are diffused into the silicon. The first diffusion, to form the collector/base junction, in the case of a transistor, is performed at a relatively high temperature, but the second diffusion, to form the emitter junction, is normally performed at a lower temperature, about 1000° C. which is comparable with that used for oxide thickening. The difference in temperatures derives from the necessity of the base region having a lower surface concentration combined with a greater junction depth than the emitter region. In effect, the first diffusion "drive-in" operation occurs in three stages, the second in two stages, the oxide thickening being the last stage in both cases. Should a two-terminal device (diode) be constructed it is possible to arrange that the oxide thickening process is conducted at a temperature at 150° C. below that of the diffusion processes, the former thus not interfering with the result of the latter to any appreciable degree. It may also be observed that the oxygen atoms required to react with silicon atoms in order to form the fresh silicon oxide layer have to pass through the contaminated layer in order to reach the interface region. It is apparent that a proportion of the contaminants present in the outer layer will also pass into the interface region and cause a measure of contamination in that region. However, if the total thickness of the oxide layer is sufficiently increased, typically from 0.5 to 0.7 micron thickness, to 1.0 to 1.5 microns thickness, the amount of contamination of the innermost region of the oxide layer is much reduced from that pertaining with the original oxide layer. In addition, a considerable amount of contamination of the oxide may be caused by diffusion out from the silicon into the oxide at the high "drive-in" temperatures. Such "out-diffusion" is very much reduced at the lower oxidation-temperature, hence contamination from this source is greatly reduced. An object of this invention is to increase substantially the passivation of the junction, and electrical measurements demonstrate that this has occurred, in that lower values of leakage currents and higher values of current gains at low currents are obtained.

Although the invention has been described in terms of a silicon diode or a symmetrical NPN silicon transistor with an annular base contact, the manufacturing methods proposed may clearly be applied to PNP silicon transistors, to NPN tor PNP silicon transistors of other geometries, and to other basic materials, although in the case of certain other materials, difficulty may be experienced in the formation of unstable oxides of that material.

What we claim is:

1. An improved process for manufacturing a planar semiconductor device, comprising the steps of:

forming an insulating layer having at least one aperture therein on a given surface of a semiconductor body, said layer being permeable to an agent capable of oxidizing said semiconductor;

selectively diffusing an impurity substance into said body through said aperture;

heating said body in the presence of said oxidizing agent to form a fresh layer of semiconductor oxide contiguous with said surface and underlying said insulating layer.

2. The process according to claim 1, wherein said heating step takes place at a temperature and for a time such that the distribution of said impurity substance within said body is not substantially altered thereby.

3. The process according to claim 1, wherein said agent is an oxygen compound.

4. The process according to claim 3, wherein said insulating layer is an oxide of said semiconductor.

5. The process according to claim 3, wherein said semiconductor is silicon.

References Cited by the Examiner

UNITED STATES PATENTS

| | | | |
|---|---|---|---|
| 2,875,384 | 2/1959 | Wallmark | 317—235 |
| 3,091,555 | 5/1963 | Smythe | 317—240 |
| 3,158,505 | 11/1964 | Sandor | 317—234 |
| 3,204,321 | 9/1965 | Kile | 317—235 |
| 3,226,612 | 12/1965 | Haenichen | 317—235 |

HYLAND BIZOT, *Primary Examiner.*

JOHN W. HUCKERT, *Examiner.*

J. D. CRAIG, *Assistant Examiner.*